(12) United States Patent
Ishii

(10) Patent No.: US 8,101,870 B2
(45) Date of Patent: Jan. 24, 2012

(54) METHOD FOR MANUFACTURING PRINTED CIRCUIT BOARD, PRINTED CIRCUIT BOARD, AND ELECTRONIC APPARATUS

(75) Inventor: Norihiro Ishii, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 403 days.

(21) Appl. No.: 12/393,642

(22) Filed: Feb. 26, 2009

(65) Prior Publication Data

US 2009/0218121 A1 Sep. 3, 2009

(30) Foreign Application Priority Data

Feb. 29, 2008 (JP) ................................. 2008-050288

(51) Int. Cl.
*H05K 1/16* (2006.01)
(52) U.S. Cl. ...................................................... 174/260
(58) Field of Classification Search .................. 174/260, 174/259
See application file for complete search history.

(56) References Cited

U.S. PATENT DOCUMENTS

| 5,275,330 | A | 1/1994 | Isaacs et al. | |
| 6,265,673 | B1 * | 7/2001 | Higashida et al. | 174/260 |
| 6,927,346 | B2 * | 8/2005 | McCormick et al. | 174/260 |
| 7,159,309 | B2 * | 1/2007 | Yamamoto et al. | 29/832 |
| 2009/0134529 | A1 * | 5/2009 | Ishii et al. | 257/779 |
| 2010/0006329 | A1 * | 1/2010 | Matsuno et al. | 174/259 |

FOREIGN PATENT DOCUMENTS

| JP | 07-007258 | 1/1995 |
| JP | 2002-171042 | 6/2002 |
| JP | 2002-289745 | 10/2002 |
| JP | 2003-273479 | 9/2003 |
| JP | 2004-079621 | 3/2004 |
| JP | 2007-129058 | 5/2007 |
| JP | 2007-329407 | 12/2007 |

OTHER PUBLICATIONS

Notification of Reason for Rejection issued by Japan Patent Office on Jun. 16, 2009 in the corresponding Japanese Patent Application No. 2008-050288.
Notification of Reason for Rejection issued by Japan Patent Office on Nov. 13, 2009 in the corresponding Japanese Patent Application No. 2008-050288.
Explanation of Non-English Language References.

* cited by examiner

*Primary Examiner* — Hae Hyeon
(74) *Attorney, Agent, or Firm* — Knobbe, Martens, Olson & Bear, LLP

(57) ABSTRACT

A method for manufacturing a printed circuit board. The method includes: preparing a printed wiring board, the printed wiring board comprising through holes and a plurality of electrode pads; coating surfaces of the plurality of electrode pads and surfaces of the through holes on an one side of the printed wiring board with a bonding material; mounting a semiconductor package on the printed wiring board such that a plurality of bumps on a surface of the semiconductor package corresponds to the plurality of electrode pads; bonding the bumps to the electrode pads by heating the printed wiring board on which the semiconductor package is mounted; and filling a space between the semiconductor package and the printed wiring board with a filler material.

14 Claims, 11 Drawing Sheets

METHOD FOR MANUFACTURING PRINTED CIRCUIT BOARD, PRINTED CIRCUIT BOARD, AND ELECTRONIC APPARATUS

CROSS-REFERENCE TO RELATED APPLICATIONS

This application is based upon and claims the benefit of priority from Japanese Patent Application No. 2008-050288, filed Feb. 29, 2008, the entire contents of which are incorporated herein by reference.

BACKGROUND

1. Field

The present invention relates to a method for manufacturing a printed circuit board made by mounting a semiconductor package on a printed wiring board, the printed circuit board, and an electronic apparatus having the printed circuit board

2. Description of Related Art

An electronic apparatus, such as a personal computer and a hard disk drive, has hitherto been provided with a printed circuit board. The printed circuit board is made by mounting a semiconductor package on a printed wiring board. A related-art printed circuit board is manufactured by a manufacturing method disclosed in; for instance, JP-A-2004-79621. In the manufacturing method, a mount process of mounting a BGA (Ball Grid Array) on a printed wiring board having through holes and a filling process of pouring an underfiller into clearance existing between the printed wiring board and the BGA are performed. Before these operations, through holes are sealed with a sealing material, such as an adhesive.

Conventionally, in connection with a printed circuit board, an underfiller is sometimes poured between a semiconductor package and a printed wiring board as in the above-described printed circuit board, in order to enhance reliability of junctions between the semiconductor package and the printed wiring board.

However, in a case where through holes are formed in the printed wiring board, when an underfiller is poured, it might flow out of a back surface of the printed wiring board through the through holes.

In this regard, as in the manufacturing method disclosed in JP-A-2004-79621, outflow of the underfiller to the back surface can be prevented by sealing the through holes with the sealing material.

However, in the manufacturing method described in JP-A-2004-79621, a sealing material must be bonded to a surface on the back (opposite side) of a mount surface on which a semiconductor package is to be mounted, whereby the manufacturing process becomes complex. Further, even when the opposite side of the through holes is sealed, the through holes on the mount surface side are opened, and the inside of the through holes still remains hollow. Hence, intrusion of the underfiller into the through holes cannot be precluded, nor can a wet spread of the underfiller over the mount surface be prevented. Therefore, the underfiller spreads over the printed wiring board more than necessary, which needs an extra underfiller.

JP-A-2004-79621 also discloses sealing of a mount surface of the semiconductor package by a sealing material. However, this technique involves a necessity for using another material for sealing the through holes that is different from the material used for mounting the semiconductor package. This necessity may make manufacturing processes complicate and result in a decrease in the reliability of junctions.

There is also an idea for relocating the through holes to other locations, thereby avoiding overflow of the underfiller. However, it may be difficult to relocate the through holes while ensuring an electrical characteristic of the printed wiring board, in consideration of arrangement of wiring.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIGS. 7A to 7C are views showing through holes and solder paste, wherein FIG. 7A is a cross-sectional view showing the through holes before formation of the solder paste, FIG. 7B is a cross-sectional view showing the through holes and the solder paste after formation of the solder paste, and FIG. 7C is a cross-sectional view showing the through holes and the solder paste after solder reflow;

FIGS. 8A to 8C are views showing through holes and solder paste of a modification, wherein FIG. 8A is a cross-sectional view showing the through holes and the solder paste after formation of the solder paste, FIG. 8B is a cross-sectional view showing the through holes and the solder paste achieved after solder reflow; FIG. 8C is another cross-sectional view of the through holes and the solder paste;

DETAILED DESCRIPTION

Various embodiments according to the invention will be described hereinafter with reference to the accompanying drawings. In general, according to one embodiment of the invention, a method for manufacturing a printed circuit board, includes: preparing a printed wiring board, the printed wiring board comprising through holes and a plurality of electrode pads; coating surfaces of the plurality of electrode pads and surfaces of the through holes on an one side of the printed wiring board with a bonding material; mounting a semiconductor package on the printed wiring board such that a plurality of bumps on a surface of the semiconductor package corresponds to the plurality of electrode pads; bonding the bumps to the electrode pads by heating the printed wiring board on which the semiconductor package is mounted; and filling a space between the semiconductor package and the printed wiring board with a filler material.

Figure 1:
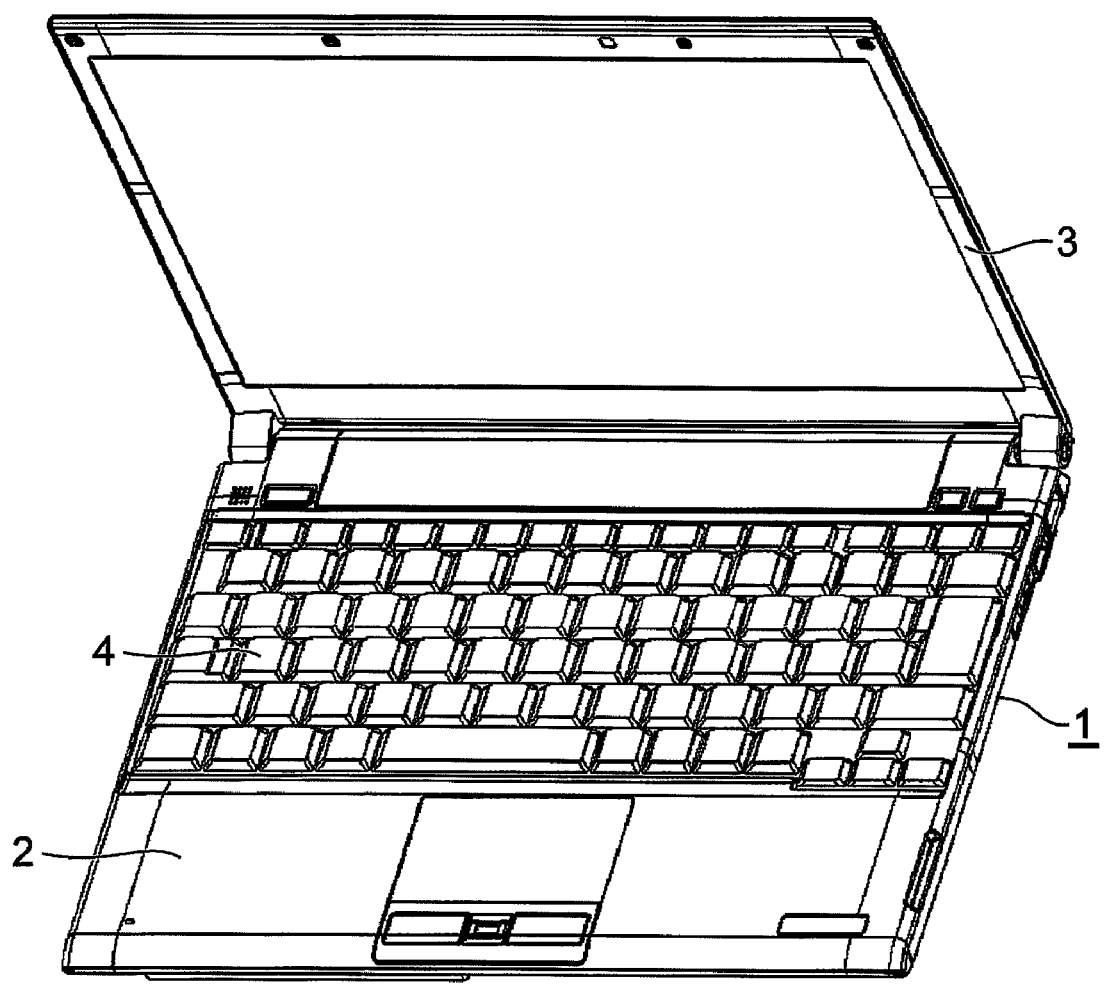
FIG. 1 is a perspective view showing the external appearance of a personal computer.

According to an embodiment, FIG. 1 is a perspective view showing the external appearance of a personal computer 1. The personal computer 1 is an electronic device according to the embodiment and has a printed circuit board 10 to be described later. In the present embodiment, an explanation is provided by taking the personal computer 1 shown in FIG. 1, as an example electronic device having a printed circuit board.

The personal computer 1 shown in FIG. 1 is a portable notebook computer having a main body housing 2 and a display unit 3 into which a liquid-crystal display panel is incorporated.

A keyboard 4 is provided on the front of the main body housing 2, and a printed circuit board 10 is provided inside the main body housing 2.

Figure 2:
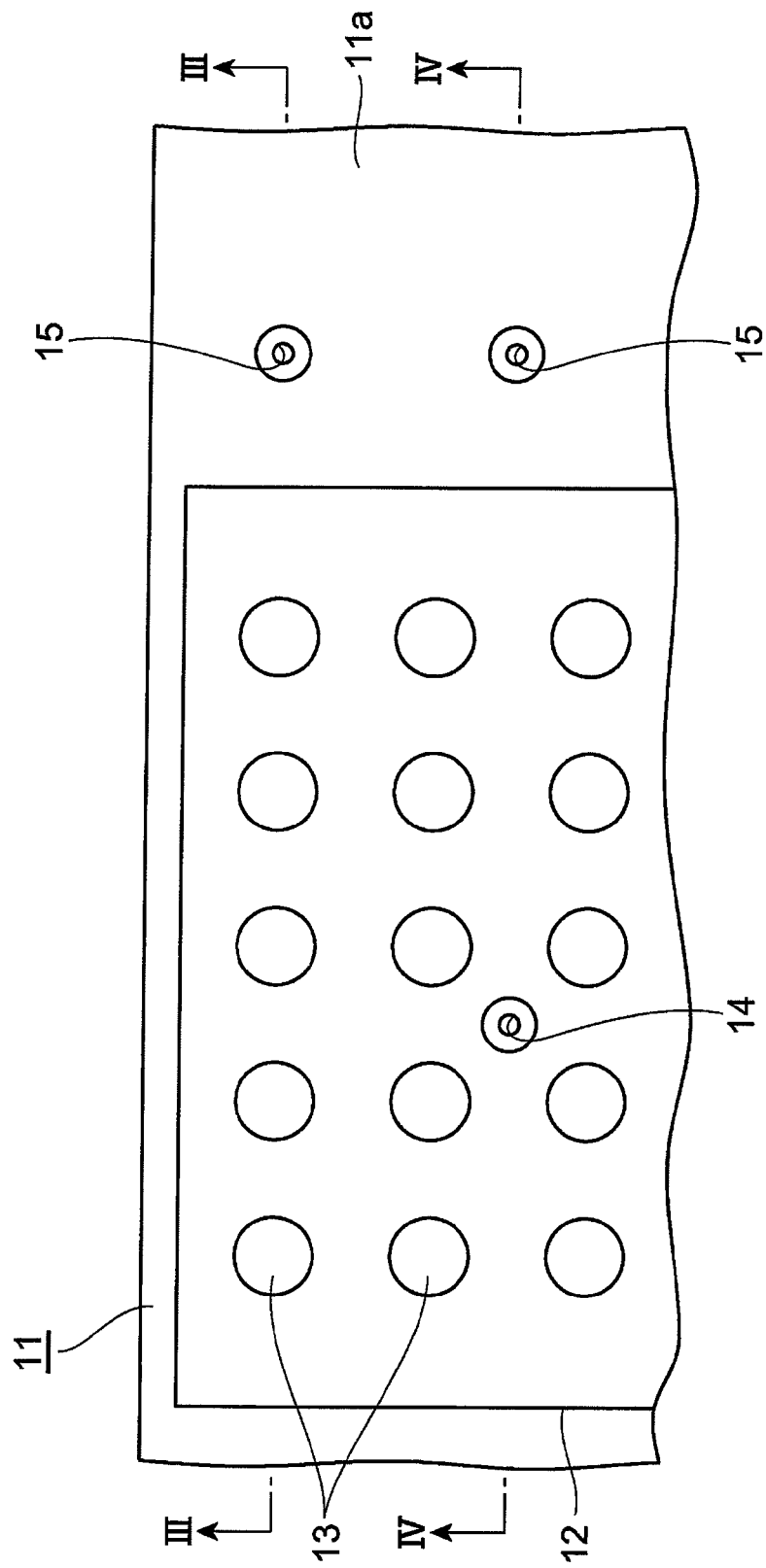
FIG. 2 is a partially-omitted plan view of a printed wiring board.
Figure 3:
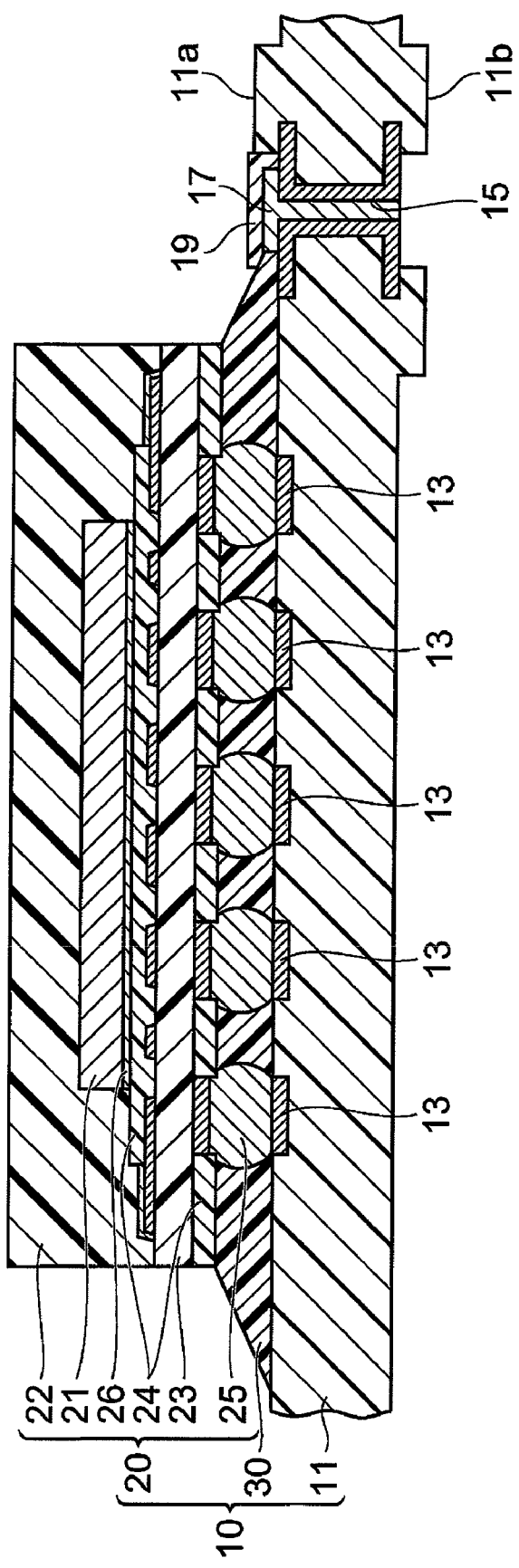
FIG. 3 is a cross-sectional view of a printed circuit board shown in FIG. 2 taken along line III-III, which is acquired by mounting a BGA on the printed wiring board and pouring an underfiller between the board and the BGA.
Figure 4:
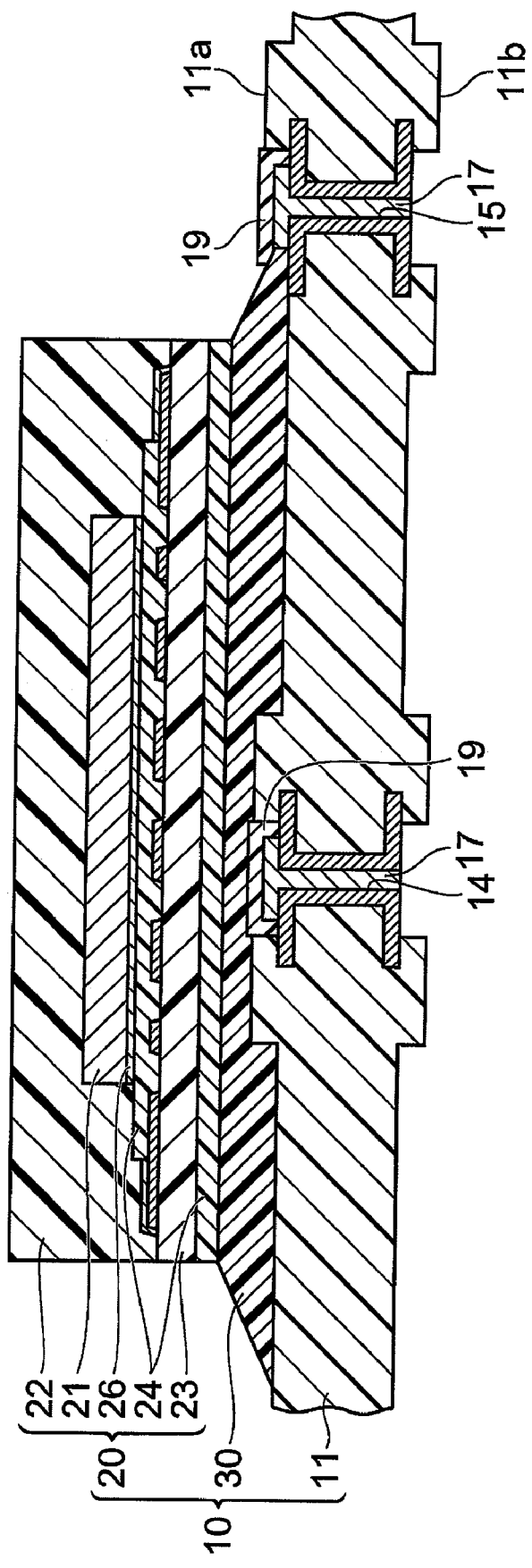
FIG. 4 is a cross-sectional view of the printed circuit board taken along line IV-IV in FIG. 2.

FIG. 2 is a partially-omitted plan view of a printed wiring board 11 to be described later; FIG. 3 is a cross-sectional view of the printed circuit board 10, which is obtained by mounting a BGA 20 on the printed wiring board 11 and pouring an underfiller 30 therebetween, cut along line III-III in FIG. 2; and FIG. 4 is a similar cross-sectional view of the printed circuit board cut along line IV-IV in FIG. 2.

As shown in FIG. 3, the printed circuit board 10 has the printed wiring board 11; the BGA 20 serving as a semiconductor package; and the underfiller 30 serving as a filler material. The BGA 20 is mounted on the printed wiring board 11, and the underfiller 30 is poured between the BGA 20 and the printed wiring board 11.

As shown in FIG. 2, in the printed wiring board 11, a mount area 12 where the BGA 20 is to be mounted is ensured on a surface 11a (a mount surface). A plurality of copper pads 13 serving as electrode pads used for mounting solder bumps 25 formed in a mount area 12 on the mount surface 11a of the printed wiring board 11, and through holes 14 are also formed in the same area. Other through holes 15 are formed in the outer portion of the mount area 12, in proximity to the outermost portion of the mount area 12. The copper pads 13 are formed in correspondence with solder bumps 25 of the BGA 20.

The through holes 14 and 15 penetrate through the mount surface 11a of the printed wiring board 11 and a back surface (rear surface) 11b. Openings of the through holes 14 and 15 are sealed with solder 17, and the inside of the through holes is filled with the solder 17.

The BGA 20 has an IC chip 21, a sealing resin 22, a core material 23, solder resists 24, solder bumps 25, and a die attachment film 26. The BGA 20 is a resin package in which the IC chip 21 is mounted on a front side of the core material 23 by way of the die attachment film 26 and in which the entirety of the front side is sealed with the sealing resin 22. The plurality of solder bumps 25 are provided on a back side of the core material.

Outflow of the underfiller 30 to the outside is prevented by solder protrusions 17a of the solder 17 that are provided in the through holes 15, which will be described later. The underfiller 30 is disposed inside of the through holes 15 with respect to the mount area 12.

Figure 5:
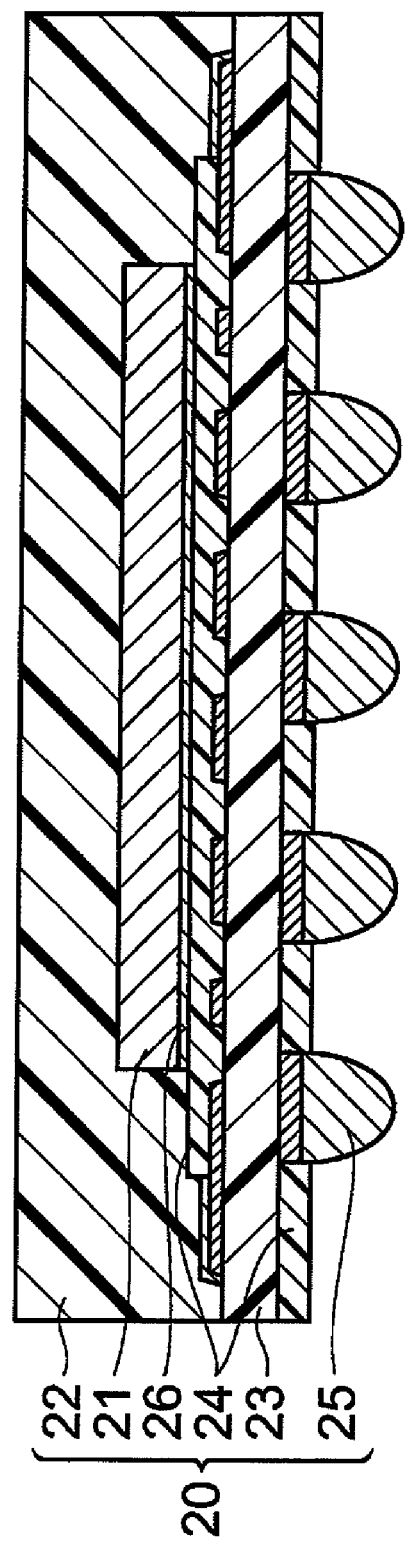
FIG. 5 is a cross-sectional view of the BGA.
Figure 6:
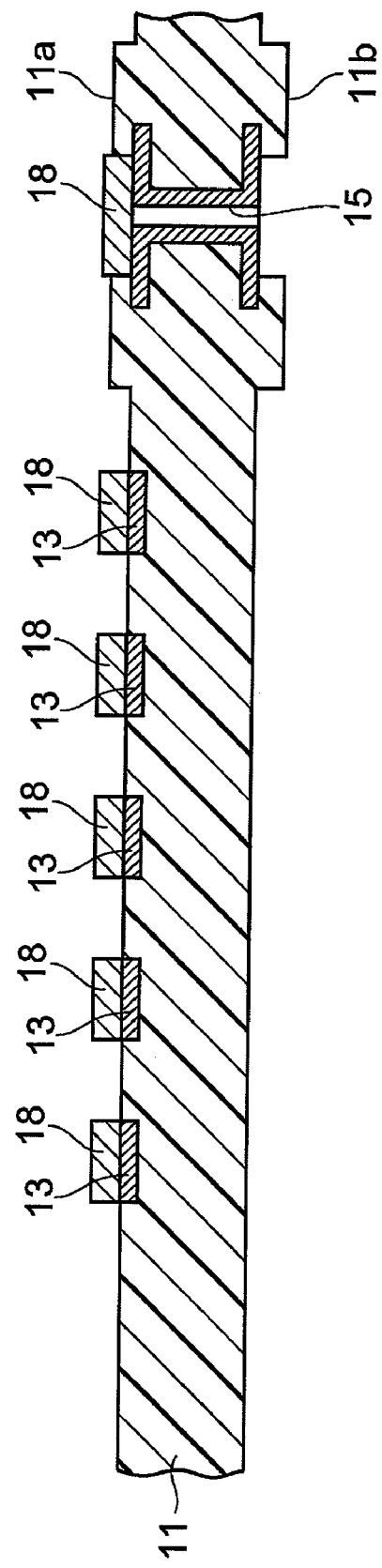
FIG. 6 is a cross-sectional view of a printed wiring board.

The printed circuit board 10 having the above-described configuration is manufactured as follows. FIG. 5 is a cross-sectional view of the BGA 20 similar to FIG. 3, and FIG. 6 is a cross-sectional view of the printed wiring board 11 similar to FIG. 3.

First, the BGA 20 and the printed wiring board 11 having the foregoing configurations are prepared. The through holes 14 and 15 of the printed wiring board 11 are not embedded with the solder 17 and remain hollow.

Next, a solder print process directed to the printed wiring board 11 is performed. The same solder is applied to surfaces of the copper pads 13 formed on the mount surface 11a and the surfaces of the through holes 14 and 15 at, thereby forming a solder past 18 over the surfaces of the copper pads 13 and the through holes 14 and 15, as shown in FIG. 6. In this case, an amount of solder corresponding to the sizes of the surfaces of the copper pads 13 is applied to the copper pads 13. An amount of solder sufficient for enabling the openings of the through holes 14 and 15 to be sealed and the inside of the through holes 14 and 15 to be filled is applied to the through holes 14 and 15. In this case, flux 19 is coated over a surface of the solder past 18. The through holes 14 and 15 are coated with the solder so as to seal respective openings of the through holes 14 and 15.

Next, the solder bumps 25 and the copper pads 13 are aligned to each other in a mutually-opposing manner, and the solder bumps 25 are mounted on the copper pads 13 by way of the solder paste 18.

Subsequently, the printed wiring board 11 is held and heated in an unillustrated reflow furnace along with the BGA 20 to be subjected to a solder reflow. By doing this, the solder past 18 is fused so that the solder bumps 25 and the copper pads 13 are soldered together. At this time, the printed wiring board 11 may also be heated in conjunction with the BGA 20, to thus cure the junctions between the solder bumps 25 and the copper pads 13. Alternatively, the printed wiring board 11 may also be exposed to ultraviolet light along with the BGA 20 instead of being heated, thereby curing the junctions between the solder bumps 25 and the copper pads 13.

Figure 7A:
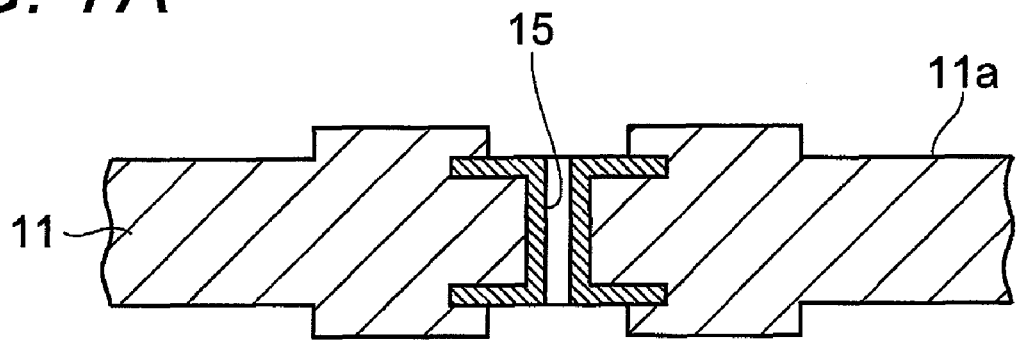
Figure 7B:
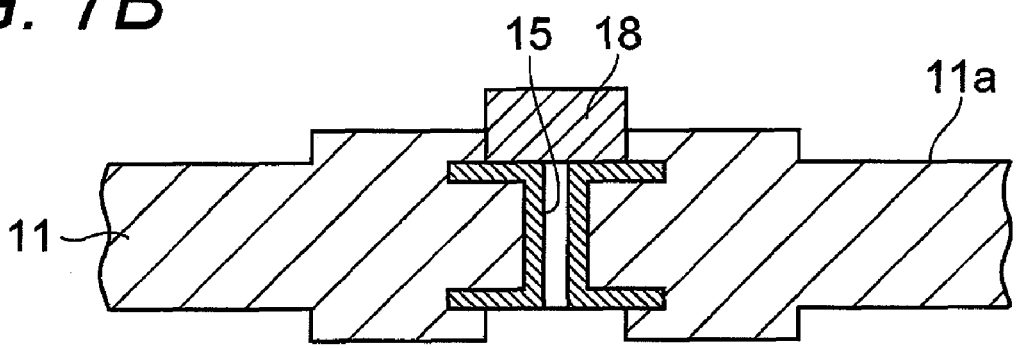
Figure 7C:
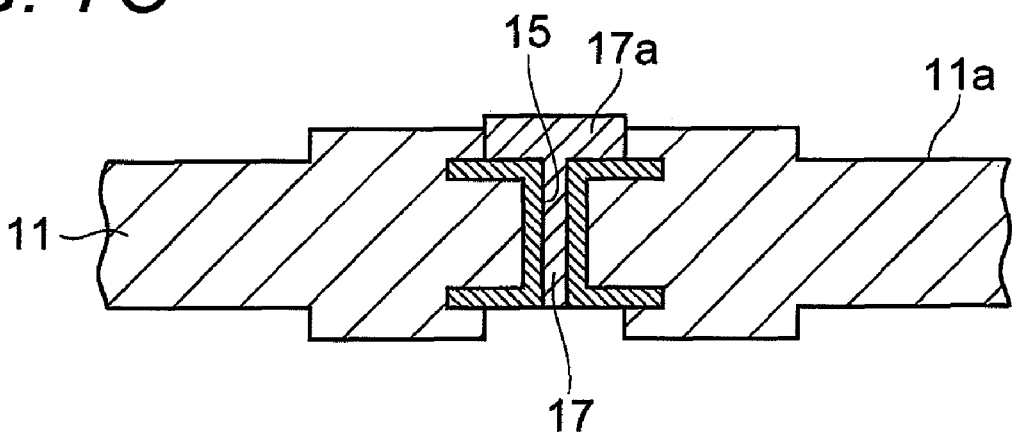

When solder reflow is performed, the solder paste 18 coating on the through holes 14 and 15 is fused, as shown in FIGS. 7B and 7C, to enter the through holes 14 and 15. Since an amount of solder sufficient for sealing the openings of the through holes 14 and 15 and for filling the inside of the through holes is applied over the through holes 14 and 15, some of the applied solder remains at the outside of the through holes 14 and 15, thereby sealing the openings from the outside. As shown in FIG. 7C, the solder protuberance 17a formed as a result of fusing of the solder paste 18 is formed on the through hole 15. The flux 19 is left on the surface of the solder protuberance 17a.

The underfiller 30 is poured between the BGA 20 and the printed wiring board 11. Thus, the above-described printed circuit board 10 can be manufactured.

Figure 9:
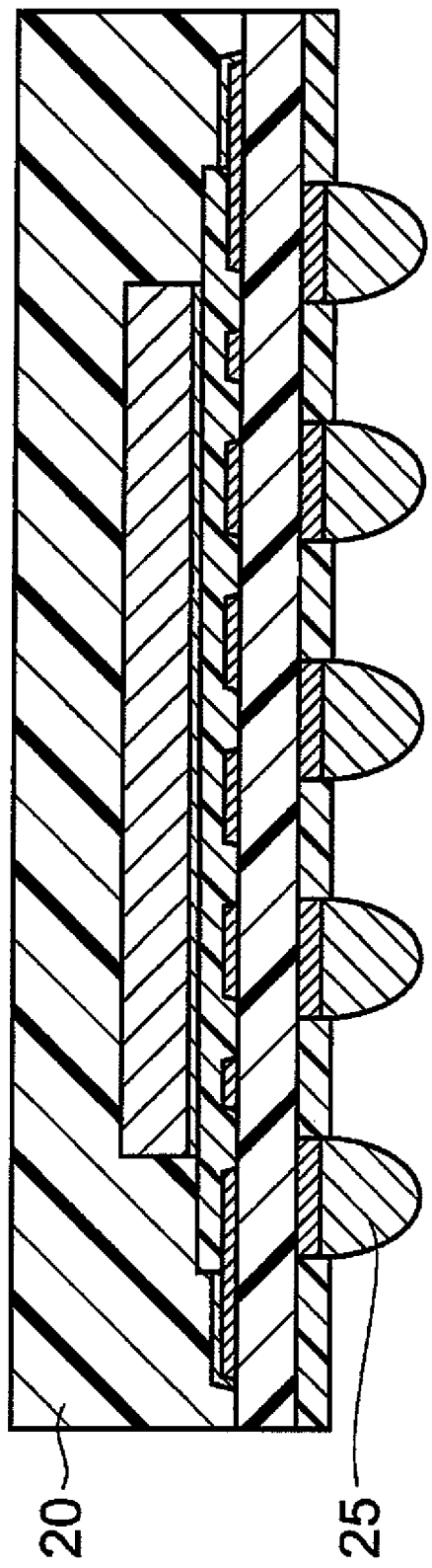
FIG. 9 is a cross-sectional view analogous to FIG. 3 showing a BGA in a printed circuit board relevant to the present invention.

A printed wiring board 101 relevant to the embodiment will now be described by reference to FIGS. 9 through 11. As shown in FIG. 9, the printed wiring board 101 is formed by mounting, on a printed wiring board 91, the BGA 20 that is similar to the printed wiring board 10, and by pouring the underfiller 30 between the BGA 20 and the printed wiring board 91.

Figure 10:
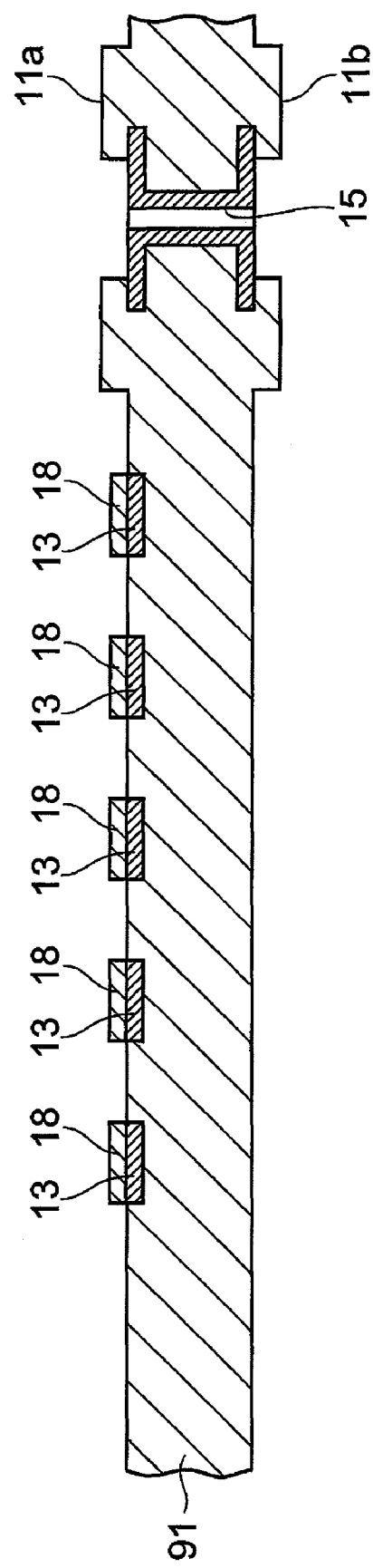
FIG. 10 is a cross-sectional view analogous to that of the printed wiring board shown in FIG. 3.

However, as shown in FIG. 10, the solder print process is directed only to the copper pads 13 and is not directed to the through holes 14 and 15. The solder paste 18 is formed on the copper pads 13, but is not formed on the in the through holes 14 and 15. Therefore, solder does not enter the through holes 14 and 15, so that the through holes are left open.

Figure 11:
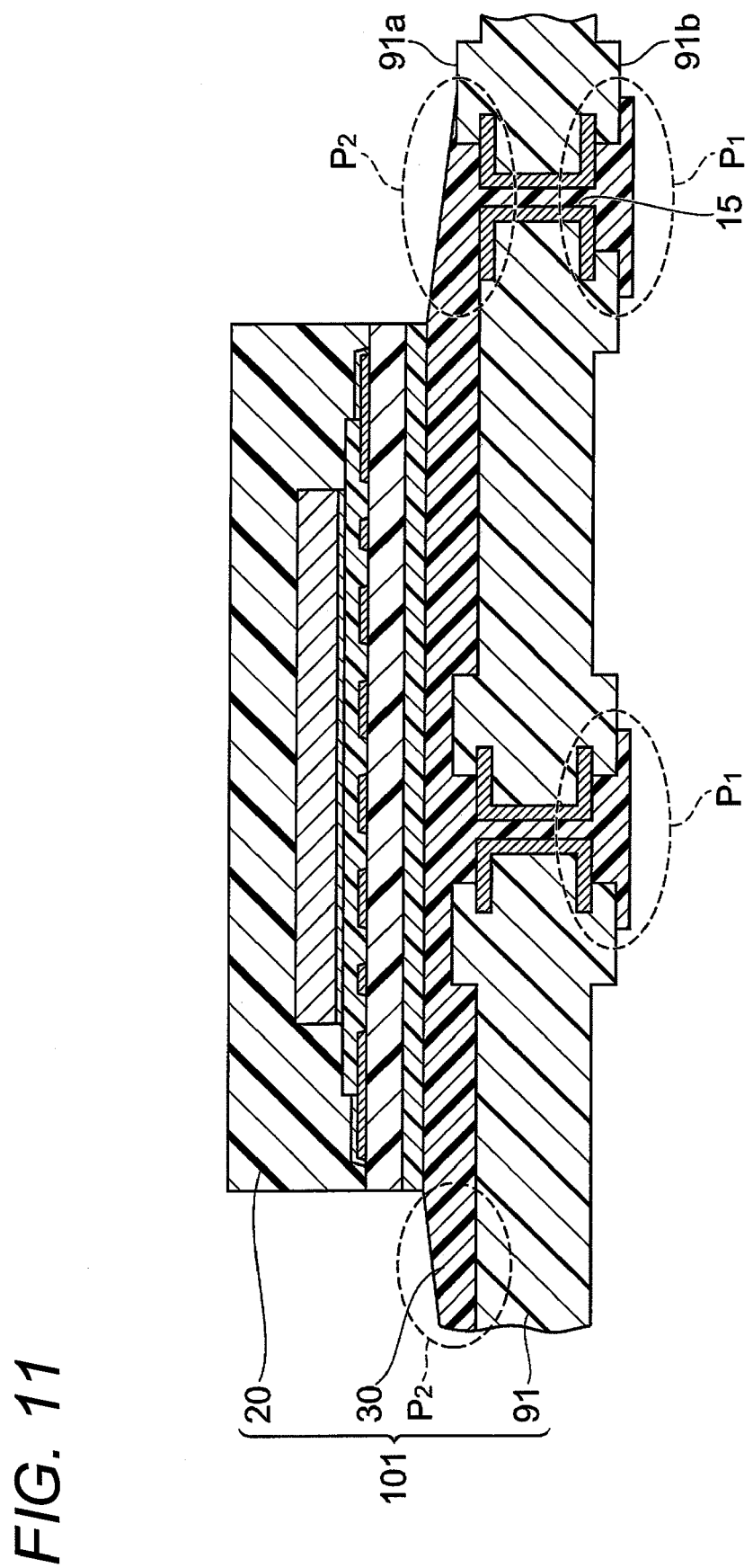
FIG. 11 is a cross-sectional view analogous to that of the printed circuit board shown in FIG. 4.

Therefore, as shown in FIG. 11, when the BGA 20 is mounted and when the underfiller 30 is subsequently poured, the underfiller 30 might flow to a rear surface 91b from a mount surface 91a by way of the through holes 14 and 15 as in locations assigned round sign P1. Further, the underfiller 30 might spread outside from the through hole 15 over the mount surface 91a as in locations assigned round sign P2.

Thus, this might result in an occurrence of a wet spread of the underfiller to the outside of the through hole 15.

In contrast, the printed circuit board 10 is subjected, in a manufacturing stage, to solder-printing directed to the copper pads 13 and the through holes 14 and 15, thereby forming the solder pastes 18 on the copper pads 13 and in the through holes 14 and 15. Therefore, the through holes 14 and 15 are filled with the solder 17 (further by means of the flux 19).

Therefore, even when the underfiller 30 is poured to the printed circuit board 10, the underfiller 30 does not flow to the rear surface 11b by way of the through holes 14 and 15. Consequently, the printed circuit board 10 can be manufactured without involvement of a pour of extra underfiller 30, and hence the amount of required underfiller 30 can be reduced. In the printed circuit board 10, the solder protuberance 17a is formed. Hence, movement of the underfiller 30 is hindered by the solder protuberance 17a, thereby making it difficult to cause a wet spread to the outside of the through holes 15. Thus, the spread of the underfiller 30 is limited to the inside of the through holes 15, and the amount of required underfiller 30 can be reduced to a much greater extent.

Further, it is not necessary to relocate the positions of the through holes 14 and 15 for precluding outflow of the underfiller 30. Hence, the through holes 14 and 15 can be formed at optimum positions taking into account electrical characteristics, such as wiring. Therefore, the degree of design freedom of the printed circuit board 10 is enhanced.

In addition, when the printed circuit board 10 is subjected to the process of printing solder on the copper pads 13 at the side of the mount surface 11a of the printed wiring board 11, the solder pastes 18 are formed at the same timing by use of the same solder on the copper pads 13 and on the surfaces of the through holes 14 and 15.

As mentioned above, in the method for manufacturing the printed circuit board 10, the through holes 14 and 15 are sealed by slightly modifying the locations where solder is printed. Hence, when compared with the case where the rear surface is sealed with a sealing material as in the case of a manufacturing method described in JP-A-2004-79621, manufacturing processes do not become complicate, and the printed circuit board 10 can be readily manufactured.

Since the through holes 14 and 15 are closed by applying, to the mount surface 11a, the same solder as that used for the copper pads 13, the reliability of junctions is not incurred.

(Modification)

Figure 8A:
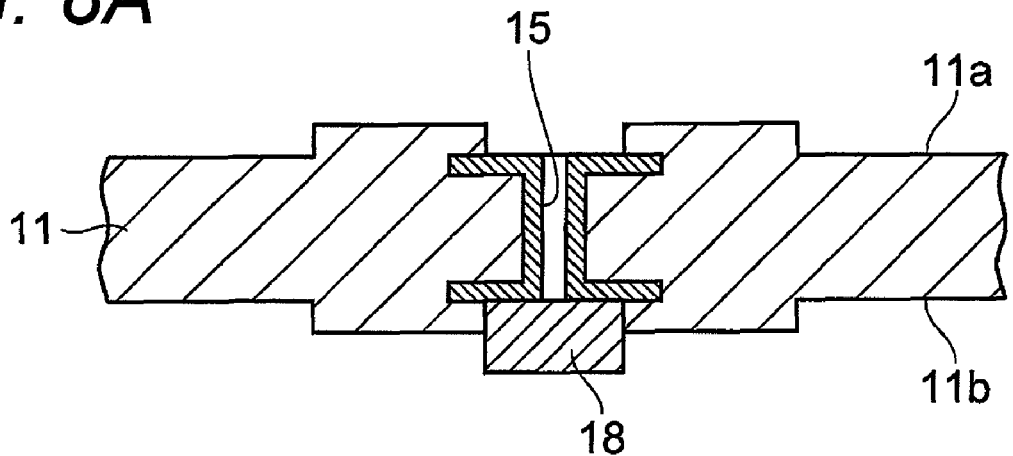
Figure 8B:
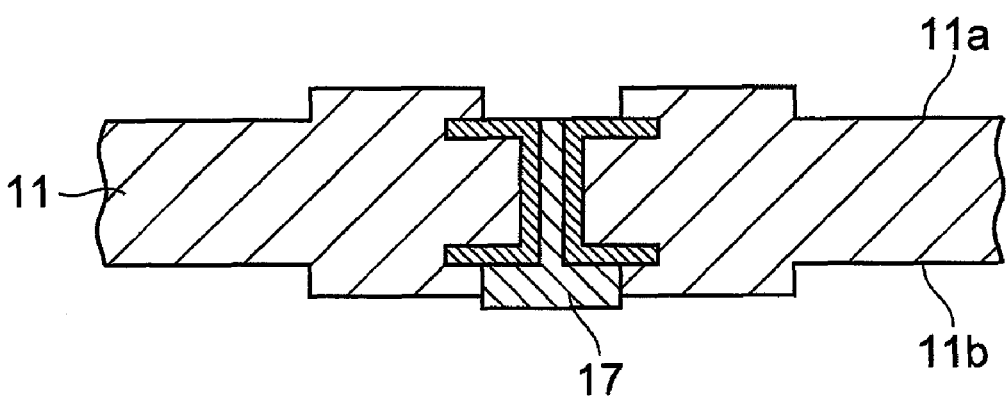
Figure 8C:
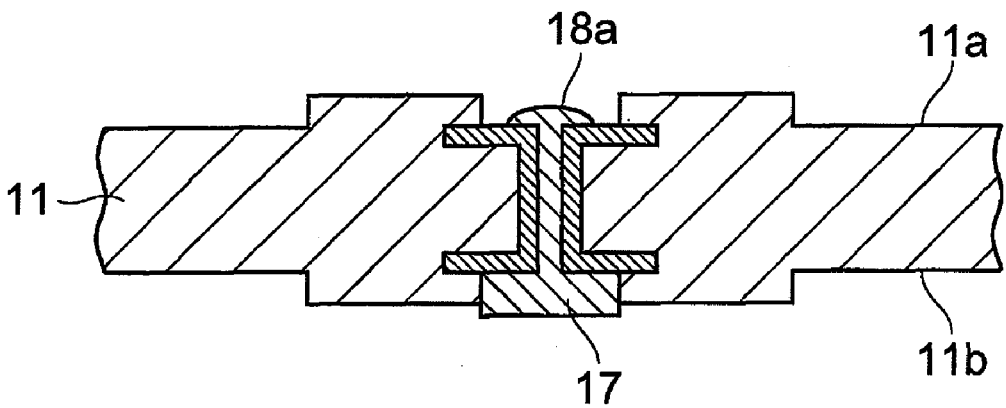

The solder paste 18 is formed on the portions of the through holes 14 and 15 located in the mount surface 11a in the embodiment. However, as shown in FIGS. 8A and 8B, the solder paste 18 may also be formed on the rear surface 11b of the through holes 14 and 15. In this case, when solder-printing is performed, amounts of solder sufficient for sealing the openings of the through holes 14 and 15 and filling the inside thereof are applied to the through holes 14 and 15. When the printed wiring board 11 is heated by solder reflow, the solder paste 18 is melted, to thus enter the inside of the through holes 14 and 15. As shown in FIG. 8B, the inside of the through holes 14 and 15 is filled with the solder 17 from the rear surface 11b, whereby the through holes 14 and 15 are closed and their openings are filled. As shown in FIG. 8C, depending on the amount of solder to be applied, a small wet spread 18a may be left on the mount surface 11a. Even in this case, the through holes 14 and 15 are filled with the solder 17, and the through holes 14 and 15 are closed.

Therefore, even when the underfiller 30 is poured after mounting of the BGA 20 on the mount surface 11a, the underfiller 30 does not flow to the rear surface 11b by way of the through holes 14 and 15. Therefore, even when the printed circuit board is manufactured as mentioned above, pouring extra underfiller 30 becomes unnecessary. Although the manufacturing method requires the rear surface 11b to be solder-printed, the same solder as that applied to the copper pads 13 can be used. Hence, manufacturing processes do not become complicate. In this case, amounts of solder applied to portions of the through holes 14 and 15 located in the rear surface 11b may be increased so that solder protrudes toward the mount surface 11a. As above, a wet spread of the underfiller 30 to the mount surface 11a can be prevented by the protrusion.

In the above embodiment, the BGA 20 is mounted on either the mount surface 11a or the rear surface 11b. However, the BGA 20 may also be mounted on both the mount surface 11a and the rear surface 11b. In this case, for instance, the mount surface 11a may be subjected to a process (an extended coating process) of coating solder to both the copper pads 13 and the through holes 14 and 15, while the rear surface 11b may be subjected to a process (an application process for mounting purpose) of coating solder only to the copper pads 13. Even in this case, the through holes 14 and 15 can be closed by means of solder, and hence outflow of the underfiller 30 to the rear surface can be prevented.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for manufacturing a printed circuit board, comprising:

preparing a printed wiring board, the printed wiring board comprising a through hole and a plurality of electrode pads;

coating surfaces of the plurality of electrode pads and a surface of the through hole on a first side of the printed wiring board with a bonding material;

mounting a semiconductor package on the printed wiring board such that a plurality of bumps on a surface of the semiconductor package corresponds to the plurality of electrode pads;

bonding the bumps to the electrode pads by heating the printed wiring board on which the semiconductor package is mounted;

forming a protrusion portion protruding from the through hole by melting the bonding material and filling the through hole with the melted bonding material; and filling a space between the semiconductor package and the printed wiring board with a filler material, wherein the protrusion portion is configured to block the filler material filled in the space between the semiconductor package and the printed wiring board from flowing into the through hole.

2. The method of claim 1, wherein the coating step comprises sealing an opening of the through hole with the bonding material.

3. The method of claim 1, wherein the heating step comprises heating the bonding material on the surface of the through hole to flow into the through hole and to seal the opening of the through hole on a second side of the printed wiring board.

4. The method of claim 1, wherein the coating step comprises coating the surface of the through hole located in a given area on the printed wiring board; and the given area comprises a first area where the semiconductor package is to be mounted and a second area in proximity to an outermost portion of the mount area.

5. The method of claim 1, wherein the bonding material comprises solder.

6. The method of claim 1, further comprising curing a connection between the bumps and the electrode pads on the printed wiring board.

7. The method of claim 6, wherein said curing comprises irradiating ultraviolet light on the printed wiring board.

8. The method of claim 1, further comprising curing a connection between the bumps and the electrode pads on the printed wiring board by heating the printed wiring board after the filling step.

9. A printed circuit board comprising:
a through hole through the printed circuit board;
a plurality of electrode pads on the printed circuit board;
a bonding material filled in the through hole; and
a protrusion portion projecting from the bonding material,
wherein the protrusion portion is configured to block a filler filled between a semiconductor package and the printed circuit board from flowing into the through hole when the semiconductor package is mounted on the printed circuit board and the filler is injected between the semiconductor package and the printed circuit board.

10. The printed circuit board of claim 9,
wherein the through hole is disposed in an outer area of a mount area where the semiconductor package is mounted on the printed circuit board; and
the filler material is at an inside position of the through hole with respect to the mount area.

11. The printed circuit board of claim 9, wherein the bonding material comprises solder.

12. An electronic apparatus, comprising
a printed wiring board comprising:
a through hole through the printed wiring board;
a plurality of electrode pads on the printed wiring board;
a bonding material filled in the through hole; and
a protrusion portion projecting from the bonding material;
a semiconductor package disposed on the printed wiring board, the semiconductor package comprising a plurality of bumps thereon, wherein the plurality of bumps and the plurality of electrode pads are connected by the bonding material; and
a filler filled between the semiconductor package and the printed wiring board,
wherein the protrusion portion is configured to block the filler filled between the semiconductor package and the printed wiring board from flowing into the through hole.

13. The electronic apparatus of claim 12,
wherein the through hole is disposed in an outer area of a mount area where the semiconductor package is mounted on the printed wiring board; and
the filler material is at an inside position of the through hole with respect to the mount area.

14. The electronic apparatus of claim 12, wherein the bonding material comprises solder.

\* \* \* \* \*